(12) United States Patent
Hansel et al.

(10) Patent No.: US 11,703,541 B2
(45) Date of Patent: Jul. 18, 2023

(54) SEMICONDUCTOR INSPECTING METHOD FOR ENSURING SCRUBBING LENGTH ON PAD

(71) Applicant: MPI Corporation, Hsinchu Hsiang (TW)

(72) Inventors: Volker Hansel, Coswig (DE);
Sebastian Giessmann, Dresden (DE);
Frank Fehrmann, Dresden (DE);
Chien-Hung Chen, Hsinchu Hsiang (TW)

(*) Notice: Subject to any disclaimer, the term of this patent is extended or adjusted under 35 U.S.C. 154(b) by 0 days.

(21) Appl. No.: 17/524,788

(22) Filed: Nov. 12, 2021

(65) Prior Publication Data

US 2022/0155365 A1 May 19, 2022

Related U.S. Application Data

(60) Provisional application No. 63/113,199, filed on Nov. 13, 2020.

(51) Int. Cl.
*G01R 31/28* (2006.01)
*H01L 21/66* (2006.01)

(52) U.S. Cl.
CPC ..... *G01R 31/2891* (2013.01); *G01R 31/2887* (2013.01); *H01L 22/12* (2013.01)

(58) Field of Classification Search
CPC ..... G01R 31/28; H01L 21/66; H01L 31/2887; H01L 31/2891
USPC ..................................................... 324/756.03
See application file for complete search history.

(56) References Cited

U.S. PATENT DOCUMENTS

| | | | | |
|---|---|---|---|---|
| 5,644,245 A | * | 7/1997 | Saitoh | G01R 31/2891 324/750.18 |
| 6,118,894 A | * | 9/2000 | Schwartz | G01R 31/2887 324/758.04 |
| 6,621,262 B2 | * | 9/2003 | Strom | G01R 31/2887 324/756.03 |
| 7,057,408 B2 | | 6/2006 | Schneidewind et al. | |
| 7,733,108 B2 | | 6/2010 | Kanev et al. | |

* cited by examiner

*Primary Examiner* — Lee E Rodak
*Assistant Examiner* — Courtney G Mcdonnough

(57) ABSTRACT

A semiconductor inspecting method for ensuring a scrubbing length on a pad includes following steps. First off, a first position of a probe needle from above is defined. In addition, a wafer comprising at least a pad is placed on a wafer chuck of a semiconductor inspecting system. Thereafter, a relative vertical movement between the probe needle and the pad is made by adopting a driving system of the semiconductor inspecting system to generate a scrubbing length on the pad. Next, whether the scrubbing length is equal to or larger than a preset value or not is recognized by adopting the vision system and the relative vertical movement is stopped by adopting the driving system.

7 Claims, 6 Drawing Sheets

US 11,703,541 B2

SEMICONDUCTOR INSPECTING METHOD FOR ENSURING SCRUBBING LENGTH ON PAD

BACKGROUND OF THE INVENTION

Field of the Disclosure

The present invention relates to a semiconductor inspecting method, and more particularly to the semiconductor inspecting method for ensuring a scrubbing length on a pad.

Description of Related Art

In the field of semiconductor wafer testing, the pad on a silicon wafer is in contact with the tip of the probe needle for electrical connection and testing. In detail, the silicon chip is on a wafer chuck. When the wafer chuck and the probe needle slowly and gradually approach to each other, the pad will be touched by the tip of the probe needle and the point on the pad touched initially by the probe needle is called a contact point.

Furthermore, the metal surface of the pad is usually covered with an oxide layer, so an appropriate force must be applied to the probe needle to scratch the oxide layer. Accordingly, the tip of the probe needle must scrape a proper scrubbing length on the oxide layer of the pad to scratch the oxide layer and make the probe needle be in contact with the metal surface of the pad to test the silicon wafer effectively.

Therefore, after the pad is in contact with the tip of the probe needle by the aforementioned method, the wafer chuck must continue to rise so as to make the tip of the probe needle scrape the proper scrubbing length on the oxide layer. The continuously rising distance of the wafer chuck to make the scrubbing length is defined in the art as an overdrive value (OD value).

In the beginning of semiconductor inspecting, the operator usually repeats the aforementioned method many times in different place of the surface of the wafer in order to detect the contact point. And then, applying a fixed proper overdrive value (e.g. 10 um or 50 um) to make the tip of the probe needle scrape the proper scrubbing length on the oxide layer, so as to make the probe needle be in contact with the metal surface of the pad to test the silicon wafer effectively during the formal semiconductor inspecting next.

In the traditional semiconductor inspecting method, whether the tip of the probe needle is in contact with the pad or not is usually confirmed by manual visual inspection. In normal way, the operator checks if the probe needle is in contact with the pad via a microscope mounting above the pad. By the microscope, the operator sees the tip of the probe needle moving on the pad and determines whether the tip of the probe needle is in contact with the pad or not. But it is easy to misjudge because the movement is very tiny, and the tiny movement is hard to be recognized by manual visual inspection.

Once the relation of the tip of the probe needle and the pad is misjudged, the aforementioned fixed proper overdrive value will be determined incorrectly. Thus, if the fixed proper overdrive value is overestimated, the pressure of the probe needle will be too high because the probe needle and the pad are severely interfered with each other. Or, in the opposite situation, the tip of the probe needle will not be in contact with the metal surface of the pad if the fixed proper overdrive value is underestimated.

Because detecting the contact point and then determining the OD value is time-consuming, it is not cost-effective to do in every semiconductor inspecting. Thus, once the fixed proper OD value is obtained, it will be applied in the subsequent semiconductor inspecting.

However, a probe needle may be worn and shortened due to multiple contacts, the thermal expansion of the wafer is varied in different ambient temperature, and the warpage of the different wafers is also not the same. All these and other factors will make the vertical distance between the tip of the probe needle and the device under test (DUT) not aligned with a predetermined distance. As a result, the tip of the probe needle may not be in contact with the metal surface of the pad. In other words, it is hard to correct the OD value timely in corresponding to the changes of the probe and the wafer aforementioned.

Therefore, how to ensure the probe needle being in contact with the metal surface of the pad and then form the proper scrubbing length on the surface of the pad automatically is worth considering for person having ordinary skill in the art.

SUMMARY OF THE INVENTION

The objective of the present invention is to provide a semiconductor inspecting method for ensuring a scrubbing length on a pad. The semiconductor inspecting method for ensuring a scrubbing length on a pad is to make the probe needle in contact with the metal surface of the pad.

A semiconductor inspecting method for ensuring a scrubbing length on a pad includes following steps.

Step (a): A first position of a probe needle from above is defined by adopting a vision system of a semiconductor inspecting system. The probe needle is placed on a pad of a wafer and the wafer is placed on a wafer chuck of a semiconductor inspecting system.

Step (b): A relative vertical movement between the probe needle and the pad is made by adopting a driving system of the semiconductor inspecting system to generate a second position of the probe needle to make the probe needle scrub a scrubbing length on the pad.

Step (c): The scrubbing length is calculate and obtained depending on recognizing a difference between the second position and the first position by adopting the vision system.

Step (d): The relative vertical movement is stopped by adopting the driving system when the scrubbing length is equal to or larger than a preset value.

In the semiconductor inspecting method for ensuring scrubbing length on pad, whether a tip of the probe needle is contacted with the pad of the wafer or not is ensured after the step (a). In addition, a first reference height of the wafer chuck is obtained after the tip of the probe needle is contacted with the pad of the wafer, and a second reference height of the wafer chuck is obtained after the step (d). Thereafter, a difference between the first reference height and the second reference height is calculated to obtain an overdrive value.

In some embodiment, the step of ensuring the tip of the probe needle being contacted with the pad of the wafer is executed by recognizing a slight change of the probe needle from the first position by adopting the vision system of the semiconductor inspecting system. In some embodiment, the slight change is larger than a planned value. In addition, the planned value is smaller than the preset value.

In the semiconductor inspecting method for ensuring scrubbing length on pad, the vision system includes a top CCD camera mounted above the pad.

The present disclosure has the following advantages: the semiconductor inspecting method can ensure the probe needle is in contact with the metal surface of the pad automatically.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
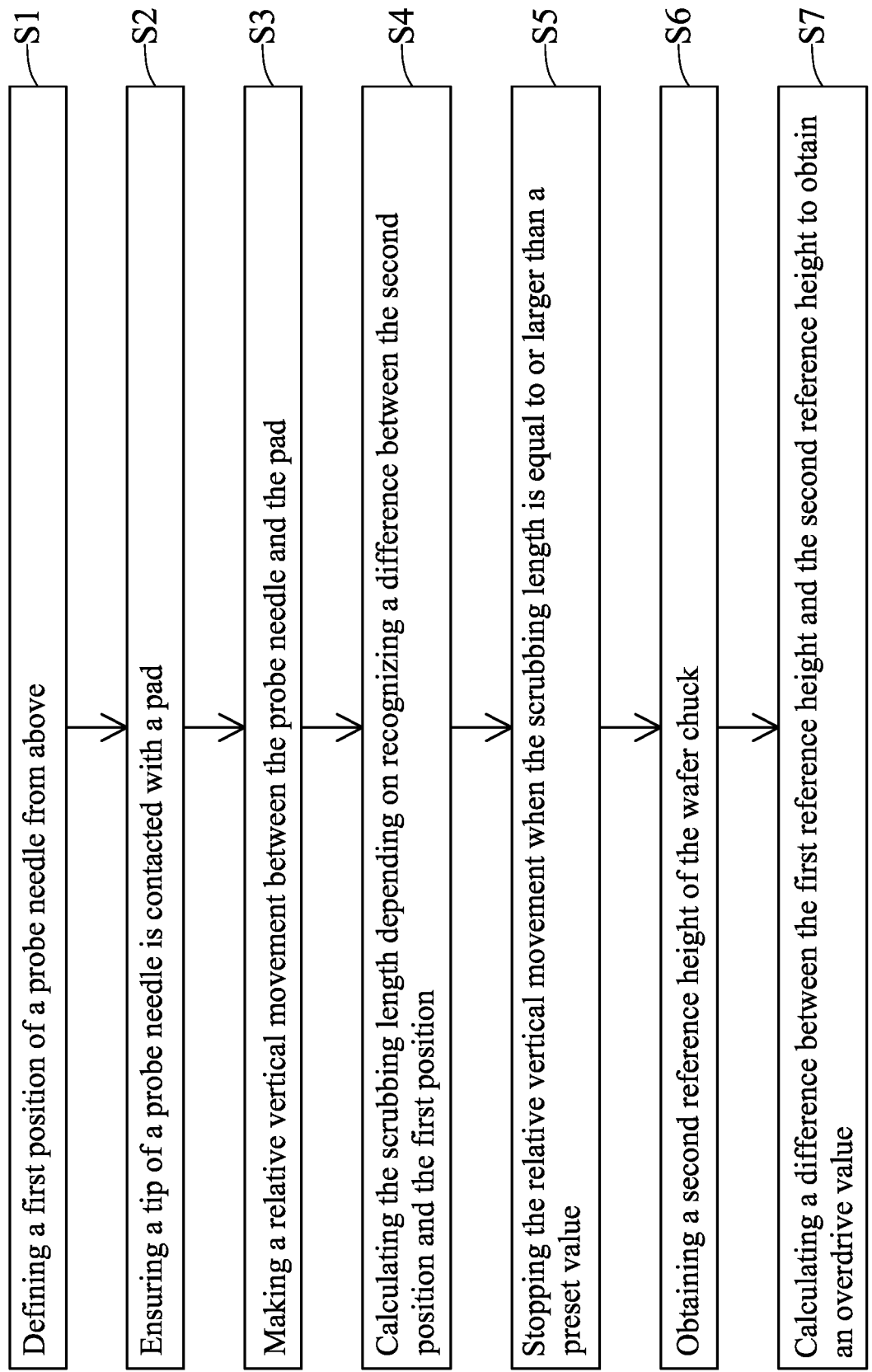
FIG. 1 illustrates a flow chart of a semiconductor inspecting method for ensuring a scrubbing length on a pad in the present disclosure.
Figure 2A:
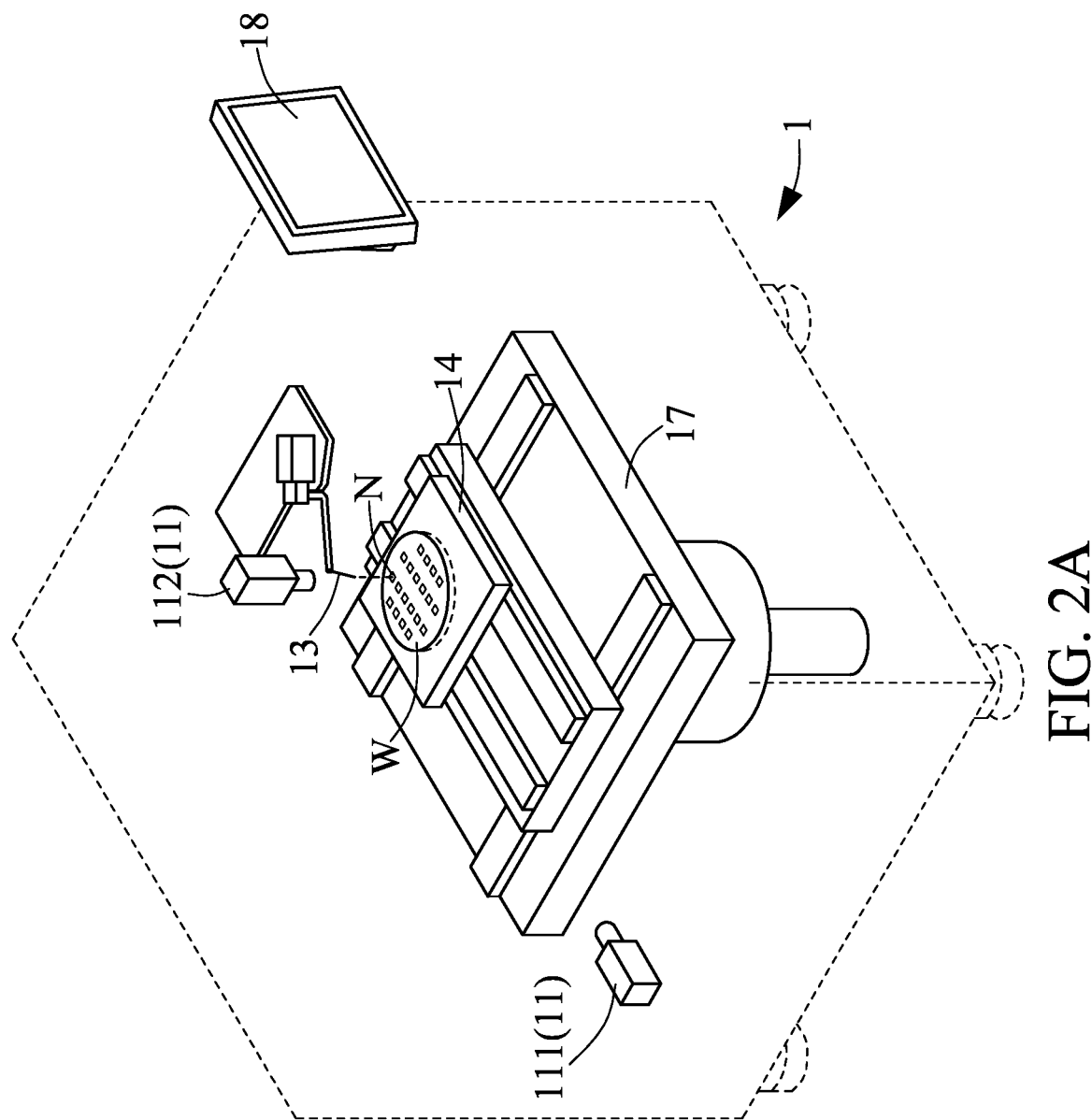
FIG. 2A illustrates a schematic view of a semiconductor inspecting system.
Figure 2B:
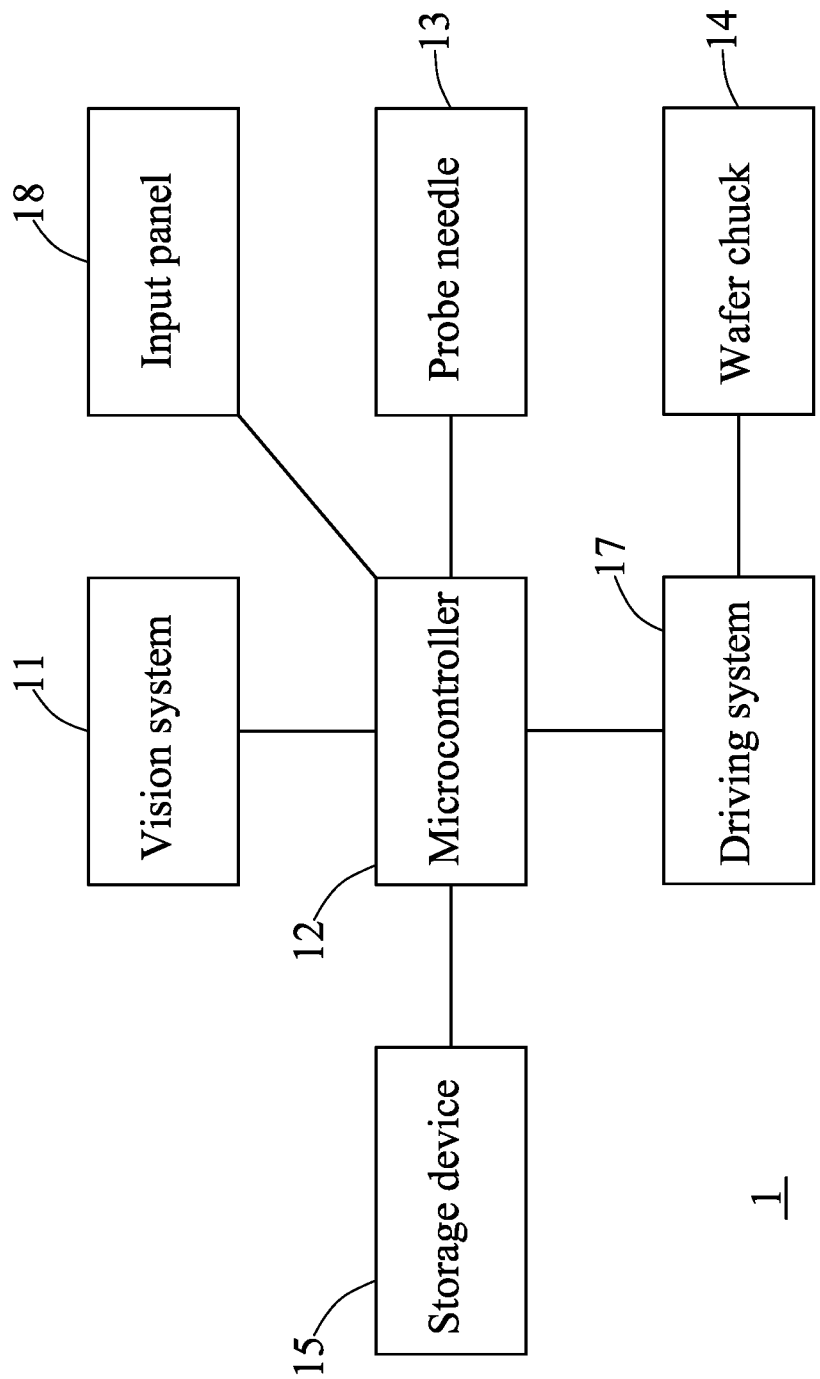
FIG. 2B illustrates a block diagram of the semiconductor inspecting system.

Please refer to FIG. 1, FIG. 2A and FIG. 2B. FIG. 1 illustrates a flow chart of a semiconductor inspecting method for ensuring a scrubbing length on a pad in the present disclosure. FIG. 2A illustrates a schematic view of a semiconductor inspecting system 1 which is used for inspecting wafer W. FIG. 2B illustrates a block diagram of the semiconductor inspecting system. The semiconductor inspecting system 1 includes a vision system 11, a microcontroller 12, a probe needle 13, a wafer chuck 14, a storage device 15, a driving system 17, and an input panel 18. The wafer W is disposed on the wafer chuck 14 and the wafer chuck 14 is configured to move vertically, so the wafer W can be moved vertically by the wafer chuck 14. In the embodiment, the vision system 11, the probe needle 13, the storage device 15, the driving system 17, and the input panel 18 are all electrically connected to the microcontroller 12. The storage device 15 is such as hard disk drive or solid-state disk.

Furthermore, the vision system 11 includes a top CCD camera 112 and a side CCD camera 111. The top CCD camera 112 is located above the probe needle 13 and the side CCD camera 111 is located on the side of the probe needle 13. The side CCD camera 111 is used for the operator to see the side view of the wafer W and the probe needle 13, but the side CCD camera 111 is an unnecessary component in some embodiments. In other words, if the vision system 11 lacks the side CCD camera 111, all the steps S1~S7 of the semiconductor inspecting method shown in FIG. 1 are still able to be implemented by the semiconductor inspecting system 1. Moreover, in the embodiment, the vision system 11 uses the CCD camera, but in some embodiments the vision system 11 uses different types of cameras, such as CMOS camera. In the embodiment, the instruction or algorithm for implementing the steps S1~S7 in FIG. 1 is stored in the storage device 15 and executed by the microcontroller 12.

Figure 3A:
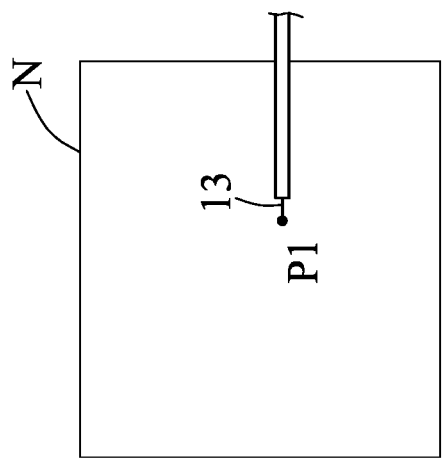
FIG. 3A to FIG. 3C illustrate a schematic view of ensuring a scrubbing length on pad.
Figure 3A:
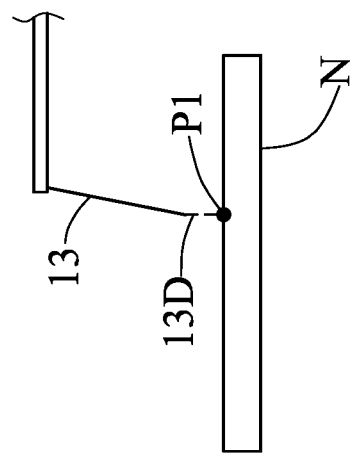
Figure 3B:
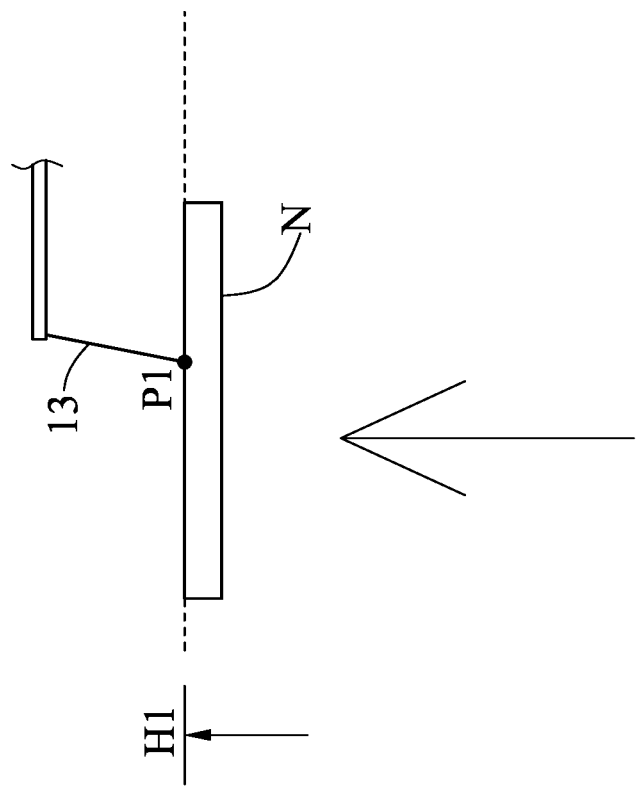
Figure 3C:
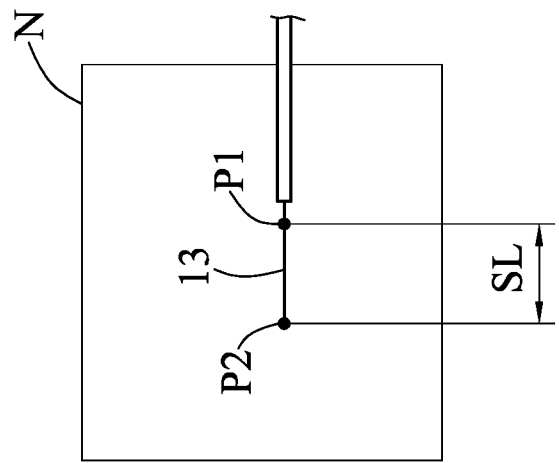
Figure 3C:
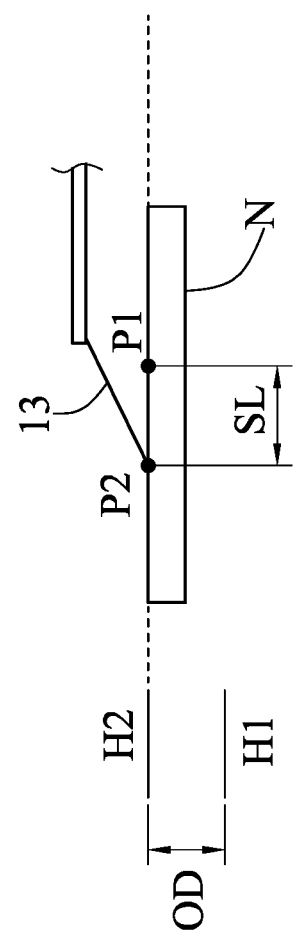

Please refer to FIG. 1 and FIG. 3A to FIG. 3C. FIG. 3A to FIG. 3C illustrate a schematic view of ensuring a scrubbing length on pad. The semiconductor inspecting method of the present invention includes following steps.

Please refer to the step S1, FIG. 2 and FIG. 3A. The left and right sides of FIG. 3A illustrate the side and top views of the probe needle 13 and the pad N. First off, a first position of a probe needle 13 from above is defined and obtained by the vision system 11. In detail, the dashed line 13D vertically extending downward from the tip of the probe needle 13 is corresponding to the first position P1 of the pad N. Namely, the first position P1 is the projection of the position of the needle 13 on the pad N. In the current embodiment, the position of the probe needle 13 is represented by a position of the tip of the probe needle 13. In some embodiment, the position of the probe needle 13 is represented by a position of other point on the probe needle 13. For example, the vision system 11 can select the thickest point on the probe needle 13 to represent the position of the probe needle 13.

In addition, the top view of the probe needle 13 and the pad N at the starting location (shown in right side of FIG. 3A) is photographed by the top CCD camera 112 and stored as a frame in a storage device 15 of the semiconductor inspecting system 1 in the embodiment. And the x and y coordinates of the first position P1 in the frame are also stored in a storage device 15. For example, the x and y coordinates of the first position P1 in the frame are such as (1000, 1200).

Next, please refer to the step S2 and FIG. 3B, whether a tip of the probe needle 13 is contacted with the pad N or not is to be ensured. In other words, in the step S2 the contact point on the pad N initially touched by the tip of the probe needle 13 is obtained and confirmed.

In the embodiment, the contact point of the probe needle 13 on the pad N of the wafer W is obtained via the vision system 11. For example, before the tip of the probe needle 13 is contacted with the pad N, the wafer chuck 14 is driven by the driving system 17 to slowly rise so that the probe needle 13 is eventually in contact with the pad N in the embodiment. In some embodiment, the wafer chuck 14 is fixed and the probe 13 is slowly lowered to make the probe needle 13 eventually being contacted with the pad N.

Then, if the wafer chuck 14 continues to rise, the probe needle 13 will slide and generate a slight change on the pad N. In the embodiment, when the vision system 11 photographs and detects the slight change of the tip of the probe needle 13 from above, it is determined that the tip of the probe needle 13 has been in contact with the pad N of the wafer W. Namely, after the slight change of the tip of the probe needle 13 from the first position is detected or recognized, the contact point is obtained and confirmed. In the embodiment, the slight change of the tip of the probe needle 13 is very tiny, so the contact point is nearly coincided with the first position P1.

However, in some embodiment, the air blown from the air conditioner in the factory or the earthquake sometimes causes the probe needle 13 to deviate slightly when the wafer chuck 14 is rising. In the situation, the vision system 11 may erroneously recognize the probe needle 13 is contacted with the pad N. Thus, the vision system 11 will not recognize the tip of the probe needle 13 has been in contact with the pad N of the wafer W until the slight change is larger than a planned value. The planned value is usually smaller than a preset value. The meaning of the preset value is described in the following content.

In some embodiments, whether a tip of the probe needle 13 is contacted with the pad N or not is ensured by other methods. For example, the vision system 11 detects the contact point by the side CCD camera 111.

After the contact point is obtained and confirmed, the step S3 is executed for obtaining a first reference height H1 of the wafer chuck 14 via the driving system 17.

Next, please refer to the step S3 and FIG. 3C. A relative vertical movement between the probe needle 13 and the pad N is made by ascending the wafer chuck 14 so that a second position P2 and the scrubbing length SL are generated on the pad N. In the embodiment, the second position P2 of the probe needle 13 is defined as the position of the tip of the probe needle 13 on the pad N after the tip of the probe needle 13 is contacted with and slid on the pad N. In addition, the vision system 11 continues to photograph the second position P2 by the top CCD camera 112 and stores the frames of the second position P2 in the storage device 15 at every interval.

As shown in the step S4, the scrubbing length SL is photographed by the top CCD camera 112 and whether the scrubbing length SL is equal to or slightly larger than the preset value is confirmed by the vision system 11. More specifically, during the relative vertical movement between the probe needle 13 and the pad N, the vision system 11 continues to photograph the probe needle 13 and the pad N by the top CCD camera 112 and checks if the scrubbing length SL reaches the preset value at every interval. In other words, the vision system 11 calculates the scrubbing length SL by recognizing a difference between the second position P2 and the first position P1 at every interval by comparing the frames of the second position P2 with the frame of the first position P1. In the embodiment, the x and y coordinates of the second position P2 in the frame are such as (700, 1200), respectively. Thus, the distance between two sets of coordinates, i.e. the first position P1 (1000, 1200) and the second position P2 (700, 1200), is 300. Please be noted the unit of length in the frame is pixel, hence the vision system 11 or the microcontroller 12 must convert it to the actual distance based on a conversion ratio stored on the storage device 15. For example, the conversion ratio is 10 pixels:1 um, so the scrubbing length SL in our embodiment is 30 um.

The preset value is determined based on the experiments or experiences. In other words, based on the experiments or experiences, there is a high possibility that the probe needle 13 will scratch the oxide layer and contact with the metal surface of the pad N when the scrubbing length SL reaches the preset value. At this moment, the tip of the probe needle 13 is touched on the second position P2 as shown in FIG. 3B. The preset value is such as stored in the storage device of the semiconductor inspecting system 1 or inputted by the operator via the input panel 18 (shown in FIG. 2A). Thus, as shown in the step S5, after the vision system 11 detects that the scrubbing length SL reaches the preset value, the condition that the probe needle 13 has been in contact with the metal surface of the pad N is confirmed, and instantaneously the driving system 17 stops the wafer chuck 14 continuing to rise.

In addition, the total length of the relative vertical movement is the rising distance of the wafer chuck 14 moves from the first reference height H1 until the scrubbing length SL on the pad N is equal to or slightly larger than the preset value.

Thereafter, as shown in the step S6, after the driving system 17 stops the wafer chuck 14 continuing to rise, a height position of the wafer chuck 14 is obtained and represented as a second reference height H2. Then, as shown in the step S7, by the semiconductor inspecting system 1, an overdrive value is calculated and obtained by subtracting the first reference height H1 from the second reference height H2. In the embodiment, the total length of the relative vertical movement between the probe needle 13 and the pad N is the overdrive value. The overdrive value is stored in the storage device 15 for further research.

Thus, because the scrubbing length SL generated on the pad N equal to or slightly larger than the preset value is ensured, the operator can confirm the probe needle 13 is in contact with the metal surface of the pad N even if the thermal deformation and the warpage on different wafers are existed or the probe needle is worn. Compared to the traditional semiconductor inspecting method, getting the fixed proper overdrive value is not required in the present disclosure because the scrubbing length SL made on the pad N can be automatically obtained and confirmed every time in the present semiconductor inspecting method. Thus, the time and the resource for getting the fixed proper overdrive value in the experiments are also saved in the present disclosure. Furthermore, because the fixed proper overdrive value is not required, in some embodiments, the steps S2, S3, S6, and S7 in FIG. 1 are also not required. In other words, even if the steps S2, S3, S6, and S7 for obtaining the overdrive value are omitted, the object of ensuring the scrubbing length SL generated on the pad N equal to or slightly larger than the preset value is also achievable.

The present invention is not limited to the foregoing embodiments, but may be modified as follows:

In the foregoing embodiments, the vision system 11 includes the top CCD camera 112 to obtain the image of the tip of the probe needle 13. In some embodiment, the vision system 11 includes the side CCD camera 111 to obtain the image of the tip of the probe needle 13. In some embodiment, a camera image is got or obtained by the scanning electron microscope (SEM) or the scanning ion microscope (SIM) from above or side.

Although the description above contains many specifics, these are merely provided to illustrate the invention and should not be construed as limitations of the invention's scope. Thus, it will be apparent to those skilled, in the art that various modifications and variations can be made in the system and processes of the present disclosure without departing from the spirit or scope of the invention.

What is claimed is:

1. A semiconductor inspecting method for ensuring scrubbing length on pad, comprising multiple steps of:
   (a) getting an image from above a probe needle by adopting a vision system of a semiconductor inspecting system, the image at least comprising the probe needle, and defining a first position of the probe needle in the image wherein a wafer comprising at least a pad is placed on a wafer chuck of a semiconductor inspecting system;
   (b) making a relative vertical movement between the probe needle and the pad by adopting a driving system of the semiconductor inspecting system to generate a second position of the probe needle in the image, and to make the probe needle scrub a scrubbing length on the pad, wherein the second position is defined as a changed position in the image corresponding to the first position of the probe needle in the image after the relative vertical movement, the changed position caused by the probe needle being contacted with the pad to generate the scrubbing length on the pad;
   (c) calculating the scrubbing length depending on recognizing a difference in the image between the second position and the first position by adopting the vision system; and
   (d) continuing making the relative vertical movement between the probe needle and the pad until the scrubbing length is equal to or larger than a preset value, and then stopping the relative vertical movement by adopting the driving system.

2. The semiconductor inspecting method for ensuring scrubbing length on pad of wafer according to claim 1, after the step (a) further comprising a step of:

ensuring a tip of the probe needle is contacted with the pad of the wafer.

3. The semiconductor inspecting method for ensuring scrubbing length on pad of wafer according to claim 2, further comprising multiple steps of:
    (e) obtaining a first reference height of the wafer chuck after the tip of the probe needle is contacted with the pad of the wafer;
    (f) obtaining a second reference height of the wafer chuck after the step (d); and
    (g) calculating a difference between the first reference height and the second reference height to obtain an overdrive value.

4. The semiconductor inspecting method for ensuring scrubbing length on pad of wafer according to claim 2, wherein the step of ensuring the tip of the probe needle being contacted with the pad of the wafer is executed by recognizing a slight change of the probe needle from the first position by adopting the vision system of the semiconductor inspecting system.

5. The semiconductor inspecting method for ensuring scrubbing length on pad of wafer according to claim 4, wherein the slight change is larger than a planned value.

6. The semiconductor inspecting method for ensuring scrubbing length on pad of wafer according to claim 5, wherein the planned value is smaller than the preset value.

7. The semiconductor inspecting method for ensuring scrubbing length on pad according to claim 1, wherein the vision system comprises a top CCD camera mounted above the pad.

* * * * *